US010630266B2

(12) United States Patent
Kim

(10) Patent No.: US 10,630,266 B2
(45) Date of Patent: Apr. 21, 2020

(54) BUFFER AMPLIFIER

(71) Applicant: DB HiTek Co., Ltd., Seoul (KR)

(72) Inventor: Ik-Hyun Kim, Seongnam-si (KR)

(73) Assignee: DB HiTek Co., Ltd., Seoul (KR)

(*) Notice: Subject to any disclaimer, the term of this patent is extended or adjusted under 35 U.S.C. 154(b) by 0 days.

(21) Appl. No.: 16/270,207

(22) Filed: Feb. 7, 2019

(65) Prior Publication Data

US 2019/0245524 A1    Aug. 8, 2019

(30) Foreign Application Priority Data

Feb. 8, 2018 (KR) .................. 10-2018-0015593

(51) Int. Cl.
| | |
|---|---|
| *H03K 3/012* | (2006.01) |
| *H03F 3/21* | (2006.01) |
| *H03K 19/0185* | (2006.01) |
| *H03F 3/72* | (2006.01) |
| *H03K 19/00* | (2006.01) |
| *H03F 3/45* | (2006.01) |

(52) U.S. Cl.
CPC ............ *H03K 3/012* (2013.01); *H03F 3/211* (2013.01); *H03F 3/45219* (2013.01); *H03F 3/72* (2013.01); *H03K 19/0013* (2013.01); *H03K 19/018528* (2013.01); *H03F 2200/516* (2013.01)

(58) Field of Classification Search
None
See application file for complete search history.

(56) References Cited

U.S. PATENT DOCUMENTS 7,148,726 B2 *  12/2006  Oka ................... H04L 25/0288
                                                                      326/86
7,304,519 B2 *  12/2007  Neubauer ................ H03K 3/00
                                                                      327/115
(Continued)

FOREIGN PATENT DOCUMENTS

KR    10-2016-0071008 A    6/2016

OTHER PUBLICATIONS

Mun Gyu Kim et al.; "A Half Power Buffer Amplifier"; Bibliographic data of KR20160071008 (A); Jun. 21, 2016; 2 pgs.; https://worldwide.espacenet.com.

*Primary Examiner* — Lincoln D Donovan
*Assistant Examiner* — Khareem E Almo
(74) *Attorney, Agent, or Firm* — Andrew D. Fortney; Central California IP Group, P.C.

(57) ABSTRACT

A buffer amplifier configured to perform voltage switching (DC bias voltage switching). The buffer amplifier includes first and second amplification blocks corresponding to first and second channels, respectively, first and second output buffer units controlled by output levels of the first and second amplification blocks, and a switch unit configured to connect or disconnect the first or second amplification block to or from the first or second output buffer unit. The switch unit includes a first switch unit configured to connect or disconnect one of the first and second amplification blocks to or from the first output buffer unit based on or in response to a control signal and a second switch unit configured to connect or disconnect another one of the first and second amplification blocks to or from the second output buffer unit based on or in response to the control signal.

19 Claims, 7 Drawing Sheets

(56) References Cited

U.S. PATENT DOCUMENTS

| | | | | |
|---|---|---|---|---|
| 8,031,002 B2* | 10/2011 | Jo | ............................ | H03F 1/301 |
| | | | | 330/264 |
| 8,044,717 B2* | 10/2011 | Ryat | ........................ | H03F 1/305 |
| | | | | 330/124 R |
| 8,049,536 B2* | 11/2011 | Wang | .................. | H03F 3/45192 |
| | | | | 327/108 |
| 8,228,105 B2* | 7/2012 | McLeod | .............. | H03K 5/1565 |
| | | | | 327/172 |
| 8,289,069 B2* | 10/2012 | Cheng | .................. | H03K 17/962 |
| | | | | 327/337 |
| 8,310,280 B2* | 11/2012 | Huang | ................ | H03F 3/45192 |
| | | | | 327/108 |
| 8,325,946 B2* | 12/2012 | Sakai | .................. | H03F 3/45475 |
| | | | | 381/120 |
| 8,928,421 B2* | 1/2015 | Cheng | ........................ | H03L 7/00 |
| | | | | 323/282 |
| 8,942,651 B2* | 1/2015 | Jones | .................... | H03F 1/0227 |
| | | | | 455/118 |
| 8,989,685 B2* | 3/2015 | Southcombe | ......... | H03F 1/0227 |
| | | | | 455/127.4 |
| 9,077,405 B2* | 7/2015 | Jones | .................... | H04B 1/0458 |
| 9,369,096 B2* | 6/2016 | Yuan | ..................... | H03F 3/2175 |
| 9,413,310 B2* | 8/2016 | Huang | .................... | H03F 3/217 |
| 9,455,690 B2 | 9/2016 | Kim et al. | | |
| 9,900,204 B2* | 2/2018 | Levesque | ............... | H03F 1/0227 |
| 10,243,550 B2* | 3/2019 | Nallamothu | ............. | G05F 1/561 |
| 10,311,941 B1* | 6/2019 | Lee | ......................... | G11C 7/109 |
| 10,340,918 B2* | 7/2019 | Wu | ................. | H03K 19/018521 |
| 10,425,044 B1* | 9/2019 | Venkataraman | .... | H03F 3/45246 |
| 2016/0087627 A1* | 3/2016 | Jang | ......................... | G09G 5/18 |
| | | | | 345/214 |
| 2016/0173065 A1 | 6/2016 | Kim et al. | | |

\* cited by examiner

BUFFER AMPLIFIER

CROSS REFERENCE TO RELATED APPLICATION

The present application claims priority to Korean Patent Application No. 10-2018-0015593, filed Feb. 8, 2018, the entire contents of which are incorporated herein for all purposes by this reference.

BACKGROUND OF THE INVENTION

1. Field of the Invention

The present invention relates to a buffer amplifier and, more particularly, to a buffer amplifier for a display driver IC that is on a liquid crystal display to minimize power consumption.

2. Description of the Related Art

A liquid crystal display (LCD) device includes an array of pixels arranged in rows and columns to form a pixel matrix. Each pixel includes a thin film transistor and a pixel electrode on a substrate.

A display driver IC (DDI) is an integrated circuit (IC) configured to drive a display device. A DDI controls a large number of pixels constituting a liquid crystal display (LCD) device to express various colors. A DDI transmits data in the form of an electrical signal (e.g., a high voltage level) to an LCD device so that characters, video clips, images, pictures, etc. can be displayed on the LCD device. That is, the DDI converts data (e.g., a digital signal) to RGB values (e.g., an analog signal) and transmits the analog signal to a liquid crystal display device, such as a display panel of a smart phone, a tablet PC, a TV, or the like so that an image can be displayed on the LCD device.

A DDI includes an output buffer at an output stage thereof to drive each pixel. The output stage of the DDI has hundreds of output buffers. Since each of the output buffers consumes a predetermined amount of power, power consumption at the output stage of the DDI is considerable.

The huge power consumption by the output buffers results in an increase in temperature that shortens the service life of the display device.

In the display industry, research has been intensively conducted to reduce the power consumption by the output buffers of the display driver IC. To achieve this goal, most display makers employ a half power output buffer.

Referring to FIG. 1, a conventional half power output buffer includes a first buffer VH, a second buffer VL, and a switch unit 10.

The first buffer VH receives a first input signal IN1. The first buffer VH outputs a first output signal according to the first input signal IN1. The first buffer VH outputs the first output signal within a voltage range of from VDD2MH to VDD2. The first buffer VH includes an amplifier having an operation region different from that of the second buffer VL.

The second buffer VL receives a second input signal IN2. The second buffer VL outputs a second output signal according to the second input signal IN2. The second buffer VL outputs the second output level within a voltage range of from VDD2ML (which is typically equal to VDD2MH) to VSS. The second buffer VI includes an amplifier having an operation region different from that of the first buffer VH.

The switch unit 10 includes first to fourth switches SW1 to SW4. The first switch SW1 is connected to an output terminal of the first buffer VH and outputs the first output OUT1. The second switch SW2 is connected to an output terminal of the first buffer VH and outputs the second output OUT2. The third switch SW3 is connected to an output terminal of the second buffer VL and outputs the first output OUT1. The fourth switch SW4 is connected to an output terminal of the second buffer VL and outputs the second output OUT2.

With this configuration, the half power output buffer can halve the power consumed when charging and discharging a panel by using an intermediate potential level between VDD2 and VSS.

However, since the half power output buffer includes first and second buffers that may be configured by different types of amplifiers, an inverted polarity signal (e.g., POL) at a specific output level may cause a large offset deviation.

Moreover, when the half power output buffer has a large offset deviation, it is difficult to secure a normal level of RMS voltage deviation (DVrms) unless additional offset cancellation is performed.

Referring to FIG. 2, in order to solve the above-described problem of the half power output buffer, Himax Technologies, Inc. has developed a buffer structure (hereinafter, referred to as a Himax buffer structure) that includes a buffer stage and a half power output stage.

In the Himax buffer structure, channel buffers for respective channels are of the same type. In the Himax buffer structure, two channels share one intermediate power output stage. In the Himax buffer structure, based on or in response to a polarity signal, channel buffers for first and second channels output a first output OUT1 and a second output OUT2, respectively, as illustrated in FIG. 3, or the second output OUT2 and the first output OUT1, respectively, as illustrated in FIG. 4.

The Himax buffer structure is configured such that switching is performed in both of a floating current source and an output driver. Therefore, the Himax buffer structure switches between current paths (e.g., drain-to-drain paths of a PMOS transistor and an NMOS transistor).

Therefore, there is a problem with the conventional buffer amplifier having a relatively large size because it consists of eight or more large switching transistors to perform the switching operation.

In addition, when the buffer amplifier has a relatively small size, there is a problem with an IR drop phenomenon that occurs due to RON resistance.

Furthermore, the conventional small-sized buffer amplifier has a problem of suffering a systematic offset due to an IR drop.

SUMMARY OF THE INVENTION

The present invention has been made to solve the problems occurring in the related art, and an object of the present invention is to provide a buffer amplifier that performs DC bias switching (e.g., voltage switching), unlike the conventional buffer amplifier that performs current path switching.

Another object of the present invention is to provide a buffer amplifier having a half power consumption structure at an output stage by performing voltage switching.

A further object of the present invention is to provide a buffer amplifier that performs switching only in an output driver to prevent an increase in the size of the buffer amplifier, an IR drop and/or a systematic offset, unlike the conventional art, in which switching is performed between a floating bias and an output driver.

In order to achieve the above-mentioned objects, the present invention includes various embodiments described below.

In various embodiments of the present invention, a buffer amplifier includes a first amplification block, a second amplification block, a first output buffer unit configured to receive an output level of the first amplification block, a second output buffer unit configured to receive an output level of the second amplification block, and a switch unit configured to connect or disconnect the first or second amplification block to or from the first or second output buffer unit, in which the switch unit includes (i) a first switch unit configured to connect one of the first amplification block and the second amplification block to the first output buffer based on or in response to a control signal and (ii) a second switch unit configured to connect one (e.g., a different one) of the first amplification block and the second amplification block to the second output buffer unit based on or in response to the control signal.

Each of the first and second amplification blocks may include an input unit configured to (i) amplify a first input signal (e.g., a first differential input signal) and (ii) output first to fourth currents, and an amplifier unit including a first current mirror, a second current mirror, and a biasing unit between the first current mirror and the second current mirror. The first current mirror includes a first PMOS transistor and a second PMOS transistor connected in series at a first node receiving or coupled to the first current and a third PMOS transistor and a fourth PMOS transistor connected in series at a second node receiving or coupled to the second current. The second current mirror includes a first NMOS transistor and a second NMOS transistor connected in series at a third node receiving or coupled to the third current and a third NMOS transistor and a fourth NMOS transistor connected in series at a fourth node receiving or coupled to the fourth current.

The amplifier unit may be connected to one of the first output buffer unit and the second output buffer unit by the switch unit.

The biasing unit may include a first bias circuit connected between the second PMOS transistor of the first current mirror and the second NMOS transistor of the second current mirror, and a second bias circuit connected between the fourth PMOS transistor of the first current mirror and the fourth NMOS transistor of the second current mirror.

The first current mirror and the second current mirror may each be or comprise a cascode current mirror.

Each of the first bias circuit and the second bias circuit may include an N-type transistor and a P-type transistor connected in parallel, and each of the N-type transistor and the P-type transistor may have a gate receiving a bias voltage.

The control signal may be an inverted polarity signal.

Each of the first output buffer unit and the second output buffer unit may include an N-type transistor and a P-type transistor connected in series. The first output buffer unit may have a first terminal receiving a first power supply voltage and a second terminal receiving a second power supply voltage. The second output buffer unit may have a first terminal receiving a third power supply voltage and a second terminal receiving the second power supply voltage. The first power supply voltage may be higher than the second power supply voltage, and the third power supply voltage may be lower than the second power supply voltage.

The output level of each of the first input unit and the second input unit may be configured to receive feedback from a corresponding one of the first output buffer unit and the second output buffer unit.

The first switch unit may include a first switch configured to connect or disconnect a first output node of the first amplification block to or from the P-type transistor of the first buffer unit based on or in response to the control signal, a second switch configured to connect or disconnect a first output node of the second amplification block to or from the P-type transistor of the first buffer unit based on or in response to the control signal, a third switch configured to connect or disconnect a second output node of the first amplification block to or from the N-type transistor of the second output buffer unit based on or in response to the control signal, and a fourth switch configured to connect or disconnect a second output node of the first amplification block to or from the N-type transistor of the second output buffer unit based on or in response to the control signal.

The second switch unit may include a fifth switch configured to connect or disconnect the first output node of the first amplification block to or from the P-type transistor of the second output buffer unit based on or in response to the control signal, a sixth switch configured to connect or disconnect the first output node of the second amplification block to or from the p-type transistor of the second output buffer unit based on or in response to the control signal, a seventh switch configured to connect or disconnect the second output node of the first amplification block to or the N-type transistor of the second output buffer unit based on or in response to the control signal, and an eighth switch configured to connect or disconnect the second output node of the second amplification block to or from the N-type transistor of the second output buffer unit based on or in response to the control signal.

In other embodiments of the present invention, a buffer amplifier includes a first amplification block for a first channel, a second amplification block for a second channel, a first output buffer unit configured to receive an output level of the first amplification block, a second output buffer unit configured to receive an output level of the second amplification block, and a switch unit configured to connect or disconnect the first or second amplification block to or from the first or second output buffer unit, in which each of the first amplification block and the second amplification block includes an input unit configured to output a differential current by differentially amplifying a first input signal and an amplifier unit configured to output a control signal based on or in response to the differential current. The switch unit includes a first switch subunit configured to connect one of the first amplification block and the second amplification block to the first output buffer based on or in response to the control signal and a second switch subunit configured to connect one (e.g., a different one) of the first amplification block and the second amplification block to the second output buffer unit based on or in response to the control signal.

The input unit may include a first differential amplifier. The first differential amplifier may include a first NMOS transistor connected to one of a first node and a second node of the amplifier unit and configured to receive a first input signal at a gate thereof, a second NMOS transistor connected to a remaining one of the first node and the second node of the amplifier unit and configured to receive a second input signal at a gate thereof, and a first bias unit connected to a first power supply voltage and configured to control a bias current to the first NMOS transistor and the second NMOS transistor based on or in response to a first complementary bias voltage.

The input unit may further include a second differential amplifier. The second differential amplifier may include a first PMOS transistor connected to one of a third node and a fourth node of the amplifier unit and configured to receive the first input signal at a gate thereof, a second PMOS transistor connected to a remaining one of the third node and the fourth node of the amplifier unit and configured to receive the second input signal at a gate thereof, and a second bias unit connected to a second power supply voltage and configured to control a bias current to the first PMOS transistor and the second PMOS transistor based on or in response to a first bias voltage.

The input unit may output a first current, a second current, a third current, and a fourth current. The first current may be a current that flows between a drain of the first NMOS transistor and the first node. The second current flows between a drain of the second NMOS transistor and the second node. The third current flows between a drain of the first PMOS transistor and the third node. The fourth current flows between a drain of the second PMOS transistor and the fourth node.

The amplifier unit may include a first current mirror configured to control a voltage on a first output node, the voltage on the first output node controlling a first output of the output buffer unit, based on or in response to at least one of the first current, the second current, and a second bias voltage. The first current mirror may include a third PMOS transistor and a fourth PMOS transistor connected in series at the first node and a fifth PMOS transistor and a sixth PMOS transistor connected in series at the second node.

The amplifier unit may further include a second current mirror configured to control a voltage on a second output node, the voltage on the second output node controlling a second output of the output buffer unit based on or in response to at least one of the third current, the fourth current, and a second complementary bias voltage. The second current mirror may include a third NMOS transistor and a fourth NMOS transistor connected in series at the third node and a fifth NMOS transistor and a sixth NMOS transistor connected in series at the fourth node.

The amplifier unit may further include a third bias unit connected between the first current mirror and the second current mirror. The third bias unit may include a seventh PMOS transistor configured to receive a third bias voltage at a gate thereof and a seventh NMOS transistor configured to receive a third complementary bias voltage at a gate thereof. The seventh PMOS transistor and the seventh NMOS transistor may be connected in parallel. The source and drain of the seventh PMOS transistor and the source and drain of the seventh NMOS transistor may be connected (e.g., in parallel) between a first intermediate node and a second intermediate node.

The amplifier unit may further include a fourth bias unit connected between the first current mirror and the second current mirror and having a first floating bias and a second floating bias.

Each of the first output buffer unit and the second output buffer unit may include an N-type transistor and a P-type transistor connected in series. The first output buffer unit may have a first terminal supplied with a first power supply voltage and a second terminal supplied with a second power supply voltage. The second output buffer unit may have a first terminal supplied with a third power supply voltage and a second terminal supplied with the second power supply voltage. The first power supply voltage may be higher than the third power supply voltage, and the third power supply voltage may be lower than the second power supply voltage.

The first switch unit may include a first switch configured to connect or disconnect the first output node of the first amplification block to or from the P-type transistor of the first output buffer unit based on or in response to the control signal, a second switch configured to connect or disconnect the first output node of the second amplification block to or from the P-type transistor of the first output buffer unit based on or in response to the control signal, a third switch configured to connect or disconnect the second output node of the first amplification block to or from the N-type transistor of the first output buffer unit based on or in response to the control signal, and a fourth switch configured to connect or disconnect the second output node of the second amplification block to or from the N-type transistor of the first output buffer unit based on or in response to the control signal.

The second switch unit may include a fifth switch configured to connect or disconnect the first output node of the first amplification block to or from the P-type transistor of the second output buffer unit based on or in response to the control signal, a sixth switch configured to connect to disconnect the first output node of the second amplification block to or from the P-type transistor of the second output buffer unit based on or in response to the control signal, a seventh switch configured to connect to disconnect the second output node of the first amplification block to or from the N-type transistor of the second output buffer unit base on or in response to the control signal, and an eighth switch configured to connect to disconnect the second output node of the second amplification block to or from the N-type transistor of the second output buffer unit based on or in response to the control signal.

With the configuration described above, the present invention has various advantages described below.

According to the present invention, the buffer amplifier performs voltage switching (e.g., DC bias voltage switching), thereby preventing or minimizing adverse effects such as an increase in the size of the buffer amplifier, an IR drop, and a systematic offset, unlike conventional technology, in which current switching is performed in a floating bias circuit and an output driver circuit.

In addition, the buffer amplifier includes a floating bias circuit and an output driver circuit configured to implement a half-power consumption structure at an output stage thereof, thereby minimizing any increase in power consumption of the output buffer.

In addition, the buffer amplifier minimizes the complexity of the overall layout and the influence of parasitic components.

In addition, the buffer amplifier reduces a systematic offset attributable to a VDS deviation occurring when the polarity signal is inverted, thereby eliminating any need for a chopping circuit and/or an offset compensation signal.

BRIEF DESCRIPTION OF THE DRAWINGS

The above and other objects, features and other advantages of the present disclosure will be more clearly understood from the following detailed description taken in conjunction with the accompanying drawings, in which.

DESCRIPTION OF THE PREFERRED EMBODIMENTS

Figure 1:
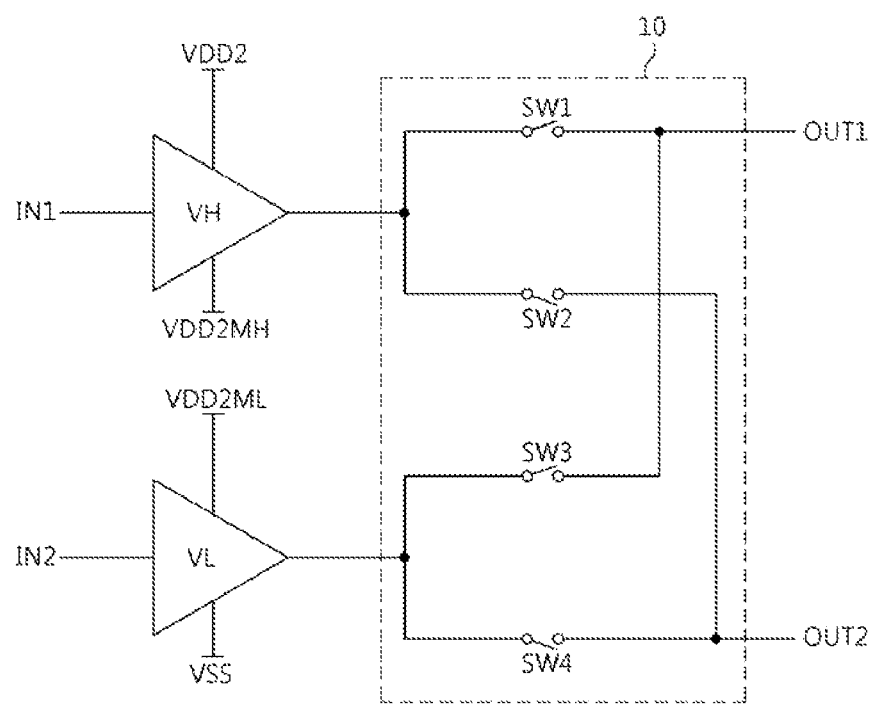
FIGS. 1 to 4 are diagrams illustrating the structure of a conventional buffer.
Figure 2:
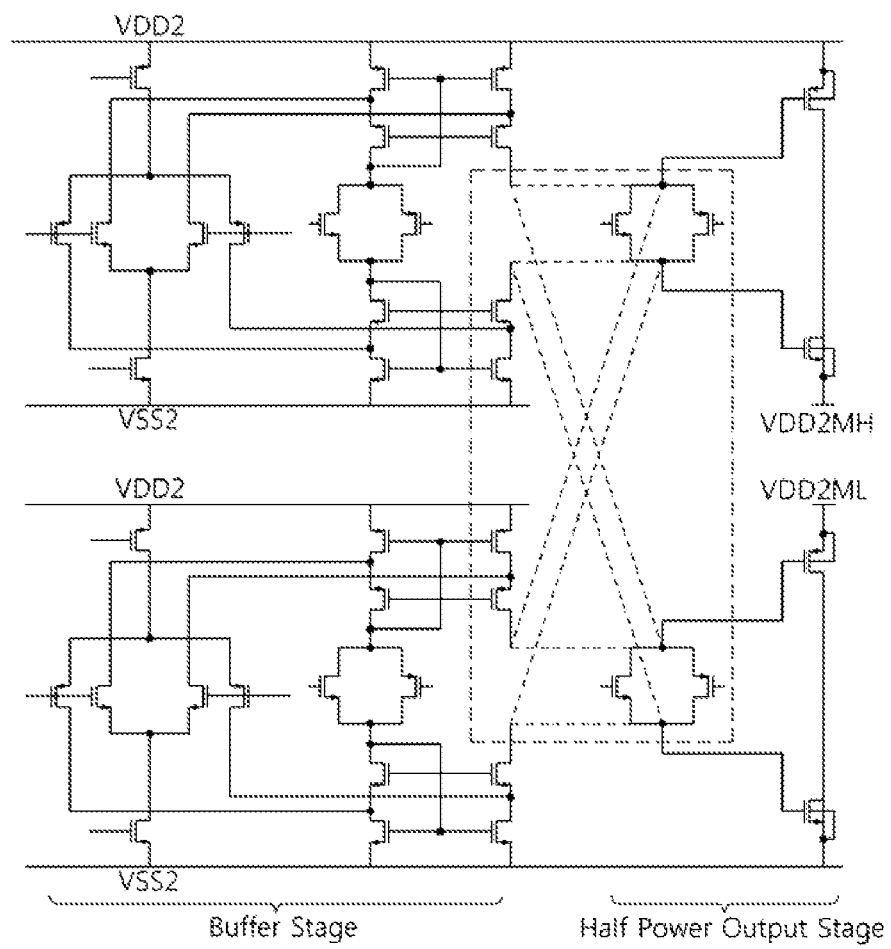
Figure 3:
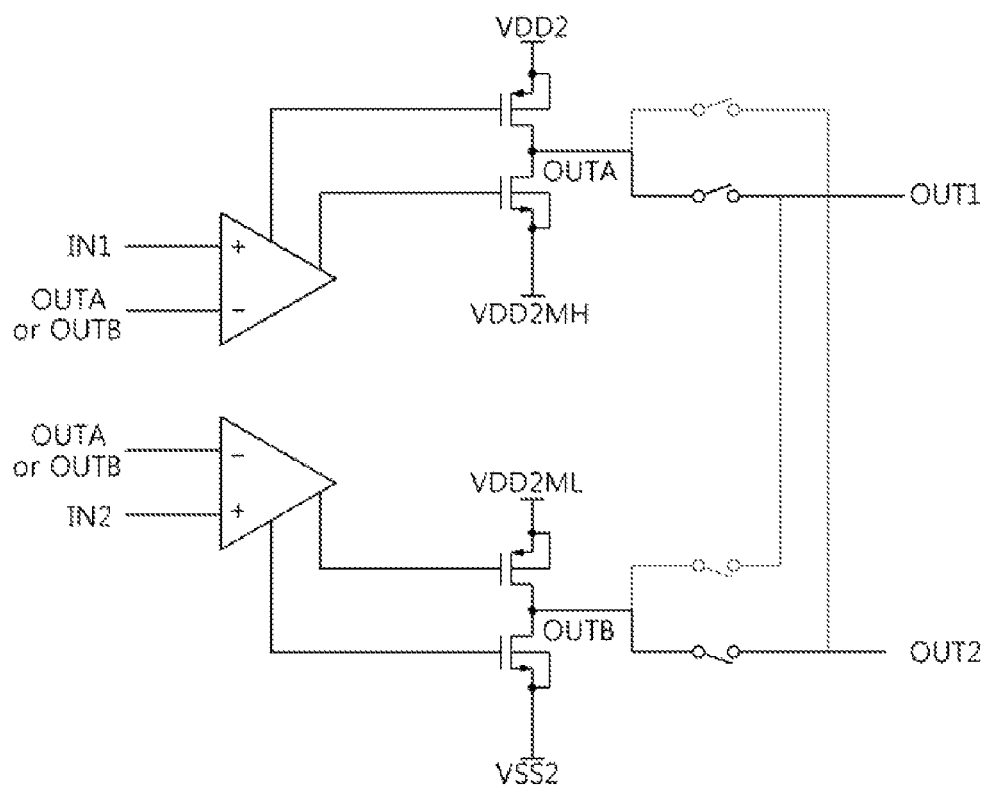
Figure 4:
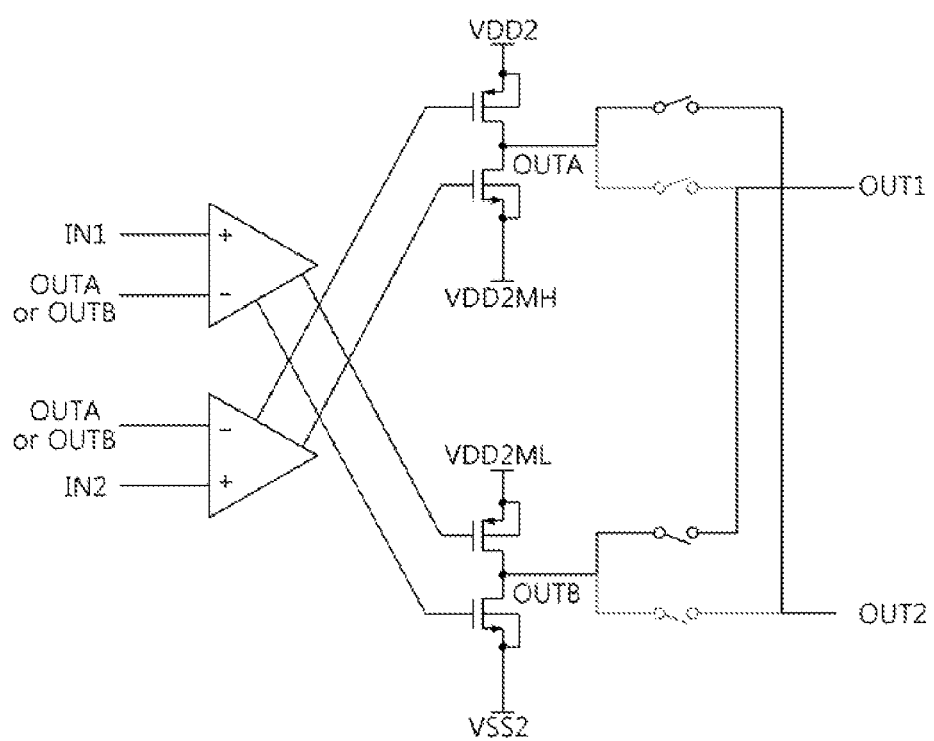

Hereinafter, preferred embodiments of the present invention will be described in detail with reference to the accompanying drawings in order to facilitate a person skilled in the art to easily carry out the technical idea of the present invention. First, components are denoted by reference numerals such that like components are denoted by like reference signs or numerals throughout the drawings. Further, in describing exemplary embodiments of the present invention, well-known functions or constructions will not be described in detail since they may unnecessarily obscure the understanding of the present invention.

The terms "first", "second", "third", etc. may be used to describe various components, elements, and/or configurations, but the components are not limited by these terms. For example, a third element is not necessarily based on the premise that a first element and a second element are necessarily present, but is used only for a convenient description through agreement of reference numerals.

Figure 5:
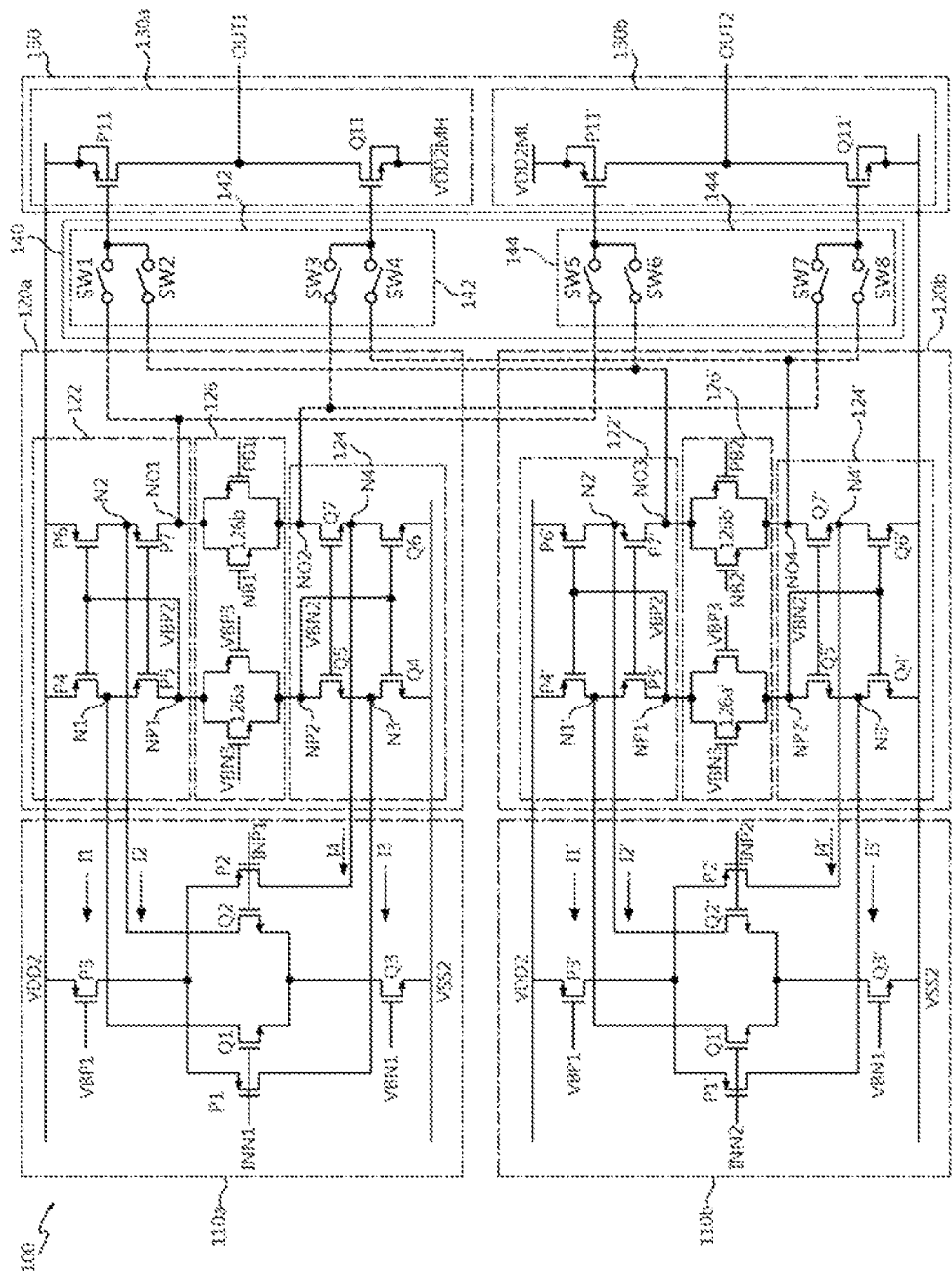
FIGS. 5 and 6 are diagrams illustrating an exemplary buffer amplifier according to embodiments of the present invention.

Hereinafter, a buffer amplifier according to embodiments of the present invention will be described in detail with reference to the accompanying drawings. FIG. 5 is a diagram illustrating an exemplary buffer amplifier according to various embodiments of the present invention.

FIG. 5 illustrates an exemplary buffer amplifier 100 that may be found in a source driver of a liquid crystal display device, but the present invention is not limited thereto.

Referring to FIG. 5, the buffer amplifier 100 includes a first input unit 110a, a second input unit 110b, a first amplifier unit 120a, a second amplifier unit 120b, an output buffer unit 130 that includes a first output buffer unit 130a and a second output buffer unit 130b, and a switch unit 140.

The buffer amplifier 100 includes a rail-to-rail amplifier. The first input unit 110a and the first amplifier unit 120a constitute a first amplification block. The second input unit 110b and the second amplifier unit 120b constitute a second amplification block.

Figure 7:
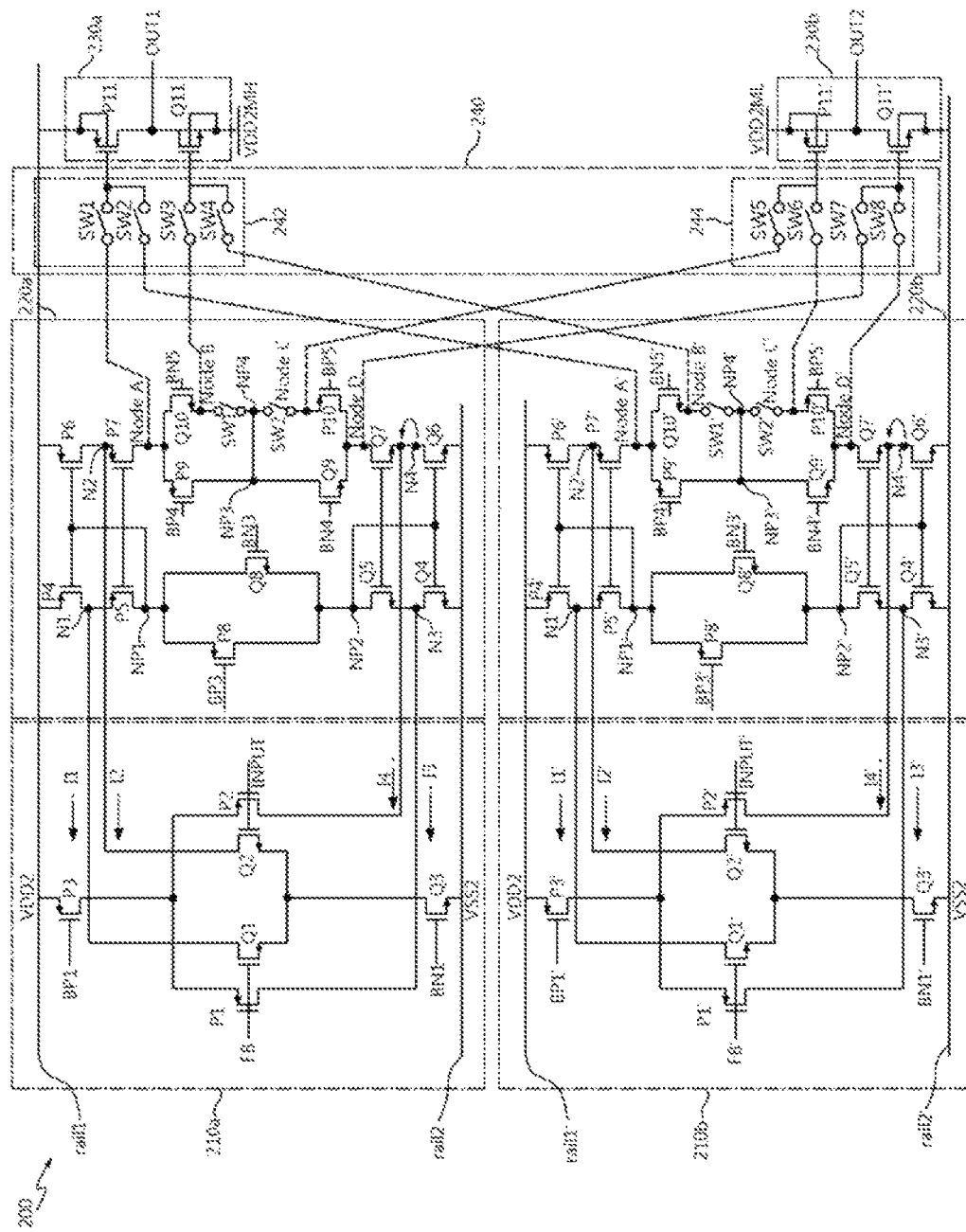
FIG. 7 is a diagram illustrating another exemplary buffer amplifier according to embodiments of the present invention.

Here, a "rail" refers to a highest level of a power supply (e.g., VDD2 or rail1; see, e.g., FIG. 7) or a lowest level of a power supply (e.g., VSS2 or rail2; see, e.g., FIG. 7). A rail-to-rail amplifier is an operational amplifier supplied with or coupled to a full range of power (e.g., ranging from VDD2 to VSS2). Input voltage levels to the rail-to-rail amplifier are within the full range of power.

In a liquid crystal display device, a source driver includes one or more buffer amplifiers. The buffer amplifier generates output levels (e.g., signals OUT1 and OUT2) to drive adjacent channels of a display panel that is driven by the source driver.

Here, a "channel" refers to a data line of the source driver, configured to drive pixels of the display panel.

The first and second input units 110a and 110b are or comprise complementary differential amplifiers. For example, each of the first and second input units 110a and 110b may be or comprise a folded cascode operational transconductance amplifier (OTA).

The first input unit 110a differentially amplifies a first differential input signal INN1 and INP1 and generates first to fourth currents I1, I2, I3, and I4. The first and second currents I1 and I2 may be or form a first differential current, and the third and fourth currents I3 and I4 may be or form a second differential current.

The second input unit 110b differentially amplifies a first input signal INN2 and a second input signal INP2 and generates first to fourth currents I1', I2', I3', and I4'.

The first input unit 110a includes a first differential amplifier and a second differential amplifier.

For example, the first differential amplifier includes (i) first and second NMOS transistors Q1 and Q2 configured to have a common source and (ii) a first bias transistor Q3. The first bias transistor Q3 is connected to the second rail VSS2 and controls a bias current supplied to the common source of the first NMOS transistor Q1 and the second NMOS transistor Q2 based on or in response to a first bias voltage VBN1.

The first bias transistor Q3 is or comprises an NMOS transistor including a gate configured to receive the first bias voltage VBN1 and a source and a drain connected between the second rail VSS2 and the common source of the first and second NMOS transistors Q1 and Q2. The second rail VSS2 supplies a first power supply (or ground) voltage VSS2.

For example, the second differential amplifier includes (i) first and second PMOS transistors P1 and P2 configured to have a common source and (ii) a second bias transistor P3. The second bias transistor P3 is connected to a first rail VDD2 and controls a bias current supplied to the common source of the first and second PMOS transistors P1 and P2 based on or in response to a second bias voltage VBP1. The second bias transistor P3 is or comprises a PMOS transistor including a gate configured to receive the second bias voltage VBP1 and a source and a drain connected between the first rail VDD2 and the common source of the first and second PMOS transistors P1 and P2.

The first rail VDD2 supplies a second power supply (e.g., positive) voltage. The second power supply voltage may be, e.g., from 1.8 V to 9 V, or any voltage or range of voltages therein.

A first component INN1 of the first differential input signal is input to the gate of the first NMOS transistor Q1 and the gate of the first PMOS transistor P1. The second, complementary component INP1 of the first differential input signal is input to the gate of the second NMOS transistor Q2 and the gate of the second PMOS transistor P2.

Each of the drains of the first and second NMOS transistors Q1 and Q2 is connected to a corresponding one of first and second nodes N1 and N2 of the first current mirror 122 (to be described later).

Each of the drains of the first and second PMOS transistors P1 and P2 is connected to a corresponding one of third and fourth nodes N3 and N4 of the second current mirror 124 (to be described later).

The first current I1 is a current that flows between the drain of the first NMOS transistor Q1 and the first node N1. The second current I2 is a current that flows between the drain of the second NMOS transistor Q2 and the second node N2. The third current I3 is a current that flows between the drain of the first PMOS transistor P1 and the third node N3. The fourth current I4 is a current that flows between the drain of the second PMOS transistor P2 and the fourth node N4.

The first input unit 110a and the second input unit 110b have the same structure. For example, the second input unit 110b includes first and second differential amplifiers. The description regarding the first to fourth currents used in the first input unit 110a and the structure of the first and second differential amplifiers also applies to the second input unit 110b.

The first amplifier unit 120a outputs control signals on the first and second output nodes NO1 and NO2 based on or in response to the first to fourth currents I1 to I4.

The first amplifier unit 120a includes a first current mirror 122, a second current mirror 124, and a bias unit 126. The first and second current mirrors 122 and 124 may each be or comprise a cascade current mirror.

In the first amplifier 120a, the first current mirror 122 includes fourth and fifth PMOS transistors P4 and P5 that are connected in series at the first node N1, which receives the first current I1. The sixth and seventh PMOS transistors P6 and P7 are connected in series at the second node N2, which receives the second current I2. The second current mirror 124 includes fourth and fifth NMOS transistors Q4 and Q5 connected in series at the third node N3, which receives the third current I3. The sixth and seventh NMOS transistors Q6 and Q7 are connected in series at the fourth node N4 and supplied with the fourth current I4. The third bias unit 126 is connected between the first current mirror 122 and the second current mirror 124.

The first current mirror 122 controls the voltage of the output node NO1, which is configured to control at least a P-type transistor P11 of the first output buffer, based on or in response to at least one of the first and second currents I1 and I2 and a bias control voltage VBP2.

Specifically, the first current mirror 122 includes the fourth and fifth PMOS transistors P4 and P5 that are connected in series between the second power supply voltage VDD2 and a first intermediate node NP1. The fourth and fifth PMOS transistors P4 and P5 are connected with each other at the first node N1, which receives the first current I1. The first current mirror 122 also includes the sixth PMOS transistor P6 connected to the second node N2, which receives the second power supply voltage VDD2 and the second current I2, and the seventh PMOS transistor P7 connected to the first output node NO1.

The gates of the fourth and sixth PMOS transistors P4 and P6 are connected with each other, the gates of the fifth and seventh PMOS transistors P5 and P7 are connected with each other, and the gate of the fourth PMOS transistor P4 is connected to the first intermediate node NP1.

The first current mirror 122 includes the fourth and fifth PMOS transistors P4 and P5 connected in series between the first rail VDD2 and the first intermediate node NP1, and the sixth and seventh PMOS transistors P6 and P7 connected in series between the first rail VDD2 and the first output node NO1.

The gate of the fourth PMOS transistor P4 is connected to the gate of the sixth PMOS transistor P6, the gate of the fifth PMOS transistor P5 is connected to the gate of the seventh PMOS transistor P7, and the gate of the fourth PMOS transistor P4 is connected to the source or drain of the fifth PMOS transistor P5.

The second current mirror 124 controls the voltage at the output node NO2 and is configured to control at least an N-type transistor Q11 of the first output buffer 130a based on or in response to at least one of the third and fourth currents I3 and I4 and a bias control voltage VBN2.

Specifically, the second current mirror 124 includes fourth and fifth NMOS transistors Q4 and Q5 that are connected in series between the power supply voltage (or ground material) VSS2 and a second intermediate node NP2. The fourth and fifth NMOS transistors Q4 and Q5 are connected with each other at the third node N3 supplied with the third current I3. In addition, the second current mirror 124 includes a sixth NMOS transistor Q6 connected to the fourth node N4 and supplied with the power supply voltage (or ground potential) VSS2 and the fourth current I4, and a seventh NMOS transistor Q7 connected to the second output node NO2.

The gates of the fourth and sixth NMOS transistors Q4 and Q6 are connected with each other, the gates of the fifth and seventh NMOS transistors Q5 and Q7 are connected with each other, and the gate of the fourth NMOS transistor Q4 is connected to the second intermediate node NP2.

In addition, the second current mirror 124 includes the fourth and fifth NMOS transistors Q4 and Q5 that are connected in series between the second rail VSS2 and the second intermediate node NP2, and the sixth and seventh NMOS transistors Q6 and Q7 that are connected in series between the second rail VSS2 and the second output node NO2.

The gate of the fourth NMOS transistor Q4 is connected with the gate of the sixth NMOS transistor Q6, the gate of the fifth NMOS transistor Q5 is connected with the gate of the seventh NMOS transistor Q7, and the gate of the fifth NMOS transistor Q5 is connected to the source or drain of the fourth NMOS transistor Q4.

The first intermediate node NP1 and the first output node NO1 are connection nodes between the first current mirror 122 and the third bias unit 126. The second intermediate node NP2 and the second output node NO2 are connection nodes between the second current mirror 124 and the third bias unit 126.

For example, the first intermediate node NP1 is a connection node between the fifth PMOS transistor P5 and the first bias circuit 126a, and the first output node NO1 is a connection node between the seventh PMOS transistor P7 and the second bias circuit 126b. The second intermediate node NP2 is a connection node between the fifth NMOS transistor Q5 and the first bias circuit 126a and the second output node NO2 is a connection node between the seventh NMOS transistor Q7 and the second bias circuit 126b.

The first node N1 of the first current mirror 122 is a connection node between the fourth PMOS transistor P4 and the fifth PMOS transistor P5 and the second node N2 of the second current mirror 124 is a connection node between the sixth PMOS transistor P6 and the seventh PMOS transistor P7.

The third node N3 of the second current mirror 124 is a connection node between the fourth NMOS transistor Q4 and the fifth NMOS transistor Q5 and the fourth node N4 of the second current mirror 124 is a connection node between the sixth NMOS transistor Q6 and the seventh NMOS transistor Q7.

The third bias unit 126, which is also referred to as a floating current source, includes a first bias circuit 126a and a second bias circuit 126b.

The first bias circuit 126a is connected between the fifth PMOS transistor P5 of the first current mirror 122 and the fifth NMOS transistor Q5 of the second current mirror 124.

The second bias circuit 126b is connected between the seventh PMOS transistor P7 of the first current mirror 122 and the seventh NMOS transistor Q7 of the second current mirror 124.

The first bias circuit 126a includes an N-type transistor and a P-type transistor connected in parallel. The source and drain of the N-type transistor and the source and drain of the P-type transistor of the first bias circuit 126a are connected between the first intermediate node NP1 and the second intermediate node NP2.

Each of the gate of the N-type transistor and the gate of the P-type transistor of the first bias circuit 126a is supplied with a bias voltage VBN3 or VBP3.

The second bias circuit 126b includes an N-type transistor and a P-type transistor connected in parallel. The source and drain of the N-type transistor and the source and drain of the P-type transistor of the second bias circuit 126b are connected between the first output node NO1 and the second output node NO2.

Each of the gate of the P-type transistor and the gate of the N-type transistor of the second bias circuit 126b is supplied with a bias voltage NB1 or PB1.

The second amplifier unit 120b outputs control signals through the third and fourth output nodes NO3 and NO4 based on or in response to the first to fourth currents I1' to I4'.

The second amplifier unit 120b includes a first current mirror 122', a second current mirror 124', and a third bias unit 126'.

The first and second current mirrors 122' and 124' are or comprise cascode current mirrors. The second amplifier unit 120b has the same structure as the first amplifier unit 120a.

The description regarding first to fourth nodes N1' to N4', first and second intermediate nodes NP1' and NP2', first and second output nodes NO3 and NO4, and first to fourth currents I1' to I4' of the second amplifier unit 120b is similar to that of the first amplifier unit 120a.

The first output buffer unit 130a includes a P-type transistor P11 and an N-type transistor Q11 connected in series. The first output buffer unit 130a has a first terminal connected to the second power supply voltage VDD2 and a second terminal connected to a third power supply voltage VDD2MH.

For example, a first source/drain terminal of the P-type transistor P11 of the first output buffer unit 130a is connected to the second power supply voltage VDD2, a second source/drain terminal of the P-type transistor P11 is connected to a first source/drain terminal of the N-type transistor Q11, and a second source/drain terminal of the N-type transistor Q11 is connected to the third power supply voltage VDD2MH.

The first to fourth output nodes NO1 to NO4 of the first and second amplification blocks are connectable to a gate of one of the P-type and N-type transistors in each of the first and second output buffer units 130a and 130b.

The output levels at the first and second output nodes NO1 and NO2 of the first amplifier unit 120a may control the operation of the first output buffer unit 130a.

For example, each of the output levels at the first and second output nodes NO1 and NO2 of the first amplifier unit 120a may be connected to a corresponding one of the gates of the P-type and N-type transistors P11 and Q11 of the first output buffer unit 130a.

The second output buffer unit 130b includes a P-type transistor P11' and an N-type transistor Q11' connected in series. The second output buffer unit 130b has a first terminal connected to the third power supply voltage VDD2ML and a second terminal connected to the first power supply voltage VSS2.

Specifically, a first source/drain terminal of the P-type transistor P11' of the second output buffer unit 130b is connected to the third power supply voltage VDD2ML, a second source/drain terminal of the P-type transistor P11' is connected to a first source/drain terminal of the N-type transistor Q11', and a second source/drain terminal of the N-type transistor Q11' is connected to the first power supply voltage VSS2.

The output levels at the first and second output nodes NO3 and NO4 of the second amplifier 120b may control the operation of the second output buffer unit 130b.

For example, each of the output levels at the first and second output nodes NO3 and NO4 of the second amplifier unit 120b may be connected to a corresponding one of the gates of the P-type and N-type transistors P11' and Q11' of the second output buffer unit 130b.

A body terminal, a body region, or a bulk region of the P-type transistor P11 of the first output buffer unit 130a is connected to the second power supply voltage VDD2.

A body terminal, a body region, or a bulk region of the N-type transistor Q11 of the first output buffer unit 130a is connected to the third power source voltage VDD2MH.

A body terminal, a body region, or a bulk region of the P-type transistor P11' of the second output buffer unit 130b is connected to the third power supply voltage VDD2ML (which may be the same as the power supply VDD2MH).

A body terminal, a body region, or a bulk region of the N-type transistor Q11' of the second output buffer unit 130b is connected to the first power supply voltage VSS2.

Each of the output levels of the first and second output buffer units 130a and 130b may be fed back to a corresponding one of the first and second input units 110a and 110b.

For example, the output level of the first output buffer unit 130a may be fed back to the first input unit 110a and the output level of the second output buffer unit 130b may be fed back to the second input unit 110b.

The switch unit 140 performs a switching operation, such that the first amplifier unit 120a and the second amplifier unit 120b may be connected to either the first output buffer unit 130a or the second output buffer unit 130b. The switch unit 140 includes a first switch subunit 142 and a second switch subunit 144.

The first switch subunit 142 connects either the first amplifier 120a or the second amplifier 120b to the first output buffer unit 130a. The first switch subunit 142 includes first to fourth switches SW1, SW2, SW3, and SW4.

The first switch SW1 connects and disconnects the first output node NO1 of the first amplifier unit 120a to and from the P-type transistor P11 of the first output buffer unit 130a.

The second switch SW2 connects and disconnects the first output node NO3 of the second amplifier unit 120b to and from the P-type transistor P11 of the first output buffer unit 130a.

The third switch SW3 connects and disconnects the second output node NO2 of the first amplifier unit 120a to and from the N-type transistor Q11 of the first output buffer unit 130a.

The fourth switch SW4 connect and disconnects the second output node NO4 of the second amplifier unit 120a to and from the N-type transistor Q11 of the first output buffer unit 130a.

The second switch subunit 144 performs a switching operation, such that the first amplifier unit 120a and the second amplifier unit 120b may be connected to the second output buffer unit 130b. The second switch unit 144 includes fifth to eighth switches SW5, SW6, SW7, and SW8.

The fifth switch SW5 connects and disconnects the first output node NO1 of the first amplifier unit 120a to and from the P-type transistor P11' of the second output buffer unit 130a.

The sixth switch SW6 connects and disconnects the first output node NO3 of the second amplifier unit 120b to and from the P-type transistor P11' of the second output buffer unit 130a.

The seventh switch SW7 connects and disconnects the second output node NO2 of the first amplifier unit 120a to and from the N-type transistor Q11' of the second output buffer unit 130a.

The eighth switch SW8 connects and disconnects the second output node NO4 of the second amplifier unit 120a to and from the N-type transistor Q11' of the second output buffer unit 130a.

The first to eighth switches SW1 to SW8 operate based on or in response to a control signal (e.g., an inverted polarity signal POL) and a complementary control signal (e.g., POLB). The complementary control signal is a signal having a logic level opposite to that of the control signal.

In this way, the buffer amplifier 100 performs a switching operation only in the output driver, unlike a conventional buffer amplifier that performs the switching operation upstream from the floating current source or downstream from the output driver.

That is, the buffer amplifier 100 performs switching between drain-to-gate paths, unlike the conventional art in which drain-to-drain paths are switched. Thus, the eight switches SW1 to SW8 that perform the switching operation have a reduced area.

In this case, the buffer amplifier 100 may be equipped with a multiplexer block configured to multiplex floating bias voltages. However, since the buffer amplifier 100 may include only relatively small transistors, an increase in the area of the buffer amplifier is negligible.

Figure 6:
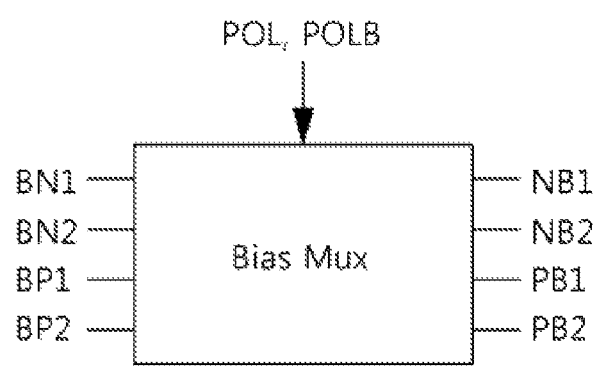

Referring to FIG. 6, the multiplexer block (Bias Mux) generates bias voltages NB1, NB2, PB1 and PB2 by multiplexing a first complementary bias voltage BN1, a second complementary bias voltage BN2, a first bias voltage BP1, and a second bias voltage BP2 based on or in response to the control signal (e.g., POL) and the complementary control signal (e.g., POLB).

Referring to FIG. 7, a buffer amplifier 200 according to another embodiment of the present invention includes a first input unit 210a, a second input unit 210b, a first amplifier unit 220a, a second amplifier unit 220b, a first output buffer unit 230a, a second output buffer unit 230b, and a switch unit 240. The buffer amplifier includes a rail-to-rail amplifier.

The term "rail" refers to the highest level (for example, VDD2) or the lowest level of a power supply voltage (for example, VSS2). The rail-to-rail amplifier may be or comprise an operational amplifier powered by the full range of power from VDD2 to VSS2. The input voltage levels are within the full range of power.

In a liquid crystal display device, a source driver includes one or more buffer amplifiers. The buffer amplifier generates an output voltage configured to drive one channel of a display panel configured to be driven by the source driver. Here, a "channel" means a data line of the source driver configured to drive pixels of a display panel.

The first input unit 210a may be or comprise an amplifier. For example, the first input unit 210a may include a folded cascode operational transconductance amplifier (OTA).

The first input unit 210a differentially amplifies a first input signal FB and a second input signal INPUT. The first input unit 210a generates first to fourth differentially-amplified currents I1, I2, I3, and I4.

The first input unit 210a includes a first differential amplifier and a second differential amplifier.

The first differential amplifier includes first and second NMOS transistors Q1 and Q2 that are configured to have a common source, and a first bias transistor Q3.

The first bias transistor Q3 is connected to a second rail rail2 (VSS2). The first bias transistor Q3 controls a bias current supplied to the common source of the first and second NMOS transistors Q1 and Q2 based on or in response to a first complementary bias voltage BN1.

The first bias transistor Q3 is an NMOS transistor including a gate to which a first complementary bias voltage BN1 is input, and a source and a drain connected between the second rail rail2 (VSS2) and the common source of the first and second NMOS transistors Q1 and Q2.

The second rail rail2 supplies a first power supply voltage or ground potential VSS2.

The second differential amplifier includes first and second PMOS transistors P1 and P2 that are configured to have a common source, and a second bias transistor P3.

The second bias transistor P3 is connected to a first rail rail1 (VDD2). The second bias transistor P3 controls a bias current supplied to the common source of the first and second PMOS transistors P1 and P2 based on or in response to a first bias voltage BP1.

The second bias transistor P3 is a PMOS transistor including a gate to which the first bias voltage BP1 is input, and a source and a drain connected between the first rail rail1 and the common source of the first and second PMOS transistors P1 and P2.

The first rail rail1 supplies a second power supply voltage VDD2. The second power supply voltage is higher than the first power supply voltage VSS2, and may be, e.g., from 1.8 V to 9 V, or any voltage or range of voltages therein.

The first NMOS transistor Q1 and the first PMOS transistor P1 receive the first input signal FB through their respective gates.

The second NMOS transistor Q2 and the second PMOS transistor P2 receive the second input signal INPUT through their respective gates. Here, the first input signal FB is one of output signals OUT1 or OUT2 of the buffer amplifier.

The first and second NMOS transistors Q1 and Q2 are connected to one of the first node N1 and the second node N2 of the first amplifier unit 220a. The first and second NMOS transistors Q1 and Q2 are connected to one of the first node N1 and the second node N2 at their respective drains.

The first and second PMOS transistors P1 and P2 are connected to one of the third node N3 and the fourth node N4 of the first amplifier unit 220a. The first and second PMOS transistors P1 and P2 are connected to one of the first node N3 and the fourth node N4 of the first amplifier unit 220a at their respective drains.

For example, in regard to the first to fourth currents I1 to I4 generated by the first input unit 210a, the first current I1 is a current flowing between the drain of the first NMOS transistor Q1 and the first node N1; the second current I2 is a current flowing between the drain of the second NMOS transistor Q2 and the second node N2; the third current I3 is a current flowing between the drain of the first PMOS transistor P1 and the third node N3; and the fourth current I4 is a current flowing between the drain of the second PMOS transistor P2 and the fourth node N4.

The first amplifier unit 220a outputs a control signal based on or in response to the currents generated by the first input unit 210a. The first amplifier unit 220a outputs control signals through first to fourth output nodes Node A, Node B, Node C, and Node D based on or in response to the first to fourth currents I1 to I4 generated by the first input unit 210a.

The first amplifier unit 220a includes a first current mirror, a second current mirror, a third bias unit, and a fourth bias unit. For example, the first current mirror and the second current mirror may each be or comprise a cascode current mirror. The third and fourth bias units are floating current sources.

The first current mirror includes fourth to seventh PMOS transistors P4 to P7. The fourth PMOS transistor P4 and the fifth PMOS transistor P5 are connected in series at the first node N1, which receives the first current I1. The sixth PMOS transistor P6 and the seventh PMOS transistor P7 are connected in series at the second node N2, which receives the second current I2.

The first current mirror controls the voltage of the first output node Node A, which is configured to control a first output OUT1 based on or in response to at least one of the first current I1, the second current I2, a bias voltage BP3. The first current mirror controls the voltage of the first output node Node A, which is, in turn, configured to control the operation of an eleventh PMOS transistor P11 that outputs a first output OUT1. The first output OUT1 is an output for a first channel.

For example, the first current mirror includes fourth to seventh PMOS transistors P4 to P7. The fourth PMOS transistor P4 and the fifth PMOS transistor P5 are connected in series between the second power supply voltage VDD2 (i.e., the first rail rail1) and a first intermediate node NP1. The fourth PMOS transistor P4 and the fifth PMOS transistor P5 are connected to each other at the first node N1, which receives the first current I1. The sixth PMOS transistor P6 is connected between the second power supply voltage VDD2 and the second node N2, which receives the second current I2. The seventh PMOS transistor P7 is connected to the first output node Node A.

The gates of the fourth PMOS transistor P4 and the sixth PMOS transistor P6 are connected to each other. The gates of the fifth PMOS transistor P5 and the seventh PMOS transistor P7 are connected to each other. The gate of the fourth PMOS transistor P4 is connected to the source or drain of the fifth PMOS transistor P5.

The first node N1 is a connection node between the fourth PMOS transistor P4 and the fifth PMOS transistor P5. The second node N2 is a connection node between the sixth PMOS transistor P6 and the seventh PMOS transistor P7.

The second current mirror includes fourth to seventh NMOS transistors Q4 to Q7. The fourth NMOS transistor Q4 and the fifth NMOS transistor Q5 are connected in series at the third node N3, which receives the third current I3. The fifth NMOS transistor Q5 and the seventh NMOS transistor Q7 are connected in series at the fourth node N4, which receives the fourth current I4.

The second current mirror controls the voltage of the fourth output node Node D, which is configured to control a second output OUT2 based on or in response to at least one of the third current I3, the fourth current I4, and the complementary bias voltage BN3. The second current mirror controls the voltage of the fourth output node Node D, which is, in turn, configured to control the operation of a twelfth NMOS transistor Q11 that outputs the second output OUT2. The second output OUT2 is an output for a second channel.

The fourth NMOS transistor Q4 and the fifth NMOS transistor Q5 are connected in series between the first power supply voltage VSS2 (i.e., the second rail rail2) and a second intermediate node NP2. The fourth NMOS transistor Q4 and the fifth NMOS transistor Q5 are connected to each other at the third node N3, which receives the third current I3. The fifth NMOS transistor Q5 is connected between the first power supply voltage VSS2 and the fourth node N4, which receives the fourth current I4. The seventh NMOS transistor Q7 is connected to the fourth output node Node D.

The gates of the fourth NMOS transistor Q4 and the sixth NMOS transistor Q6 are connected to each other. The gates of the fifth NMOS transistor Q5 and the seventh NMOS transistor Q7 are connected to each other. The gate of the fourth NMOS transistor Q4 is connected to the second intermediate node NP2. The gate of the fourth NMOS transistor Q4 is connected to the source or drain of the fifth NMOS transistor Q5.

The first intermediate node NP1 and the first output node Node A are connection nodes between the first current mirror and the fourth bias unit. The second intermediate node NP2 and the fourth output node Node D are connection nodes between the second current mirror and the fourth bias unit.

For example, the first intermediate node NP1 is a connection node between the fifth PMOS transistor P5 and the third bias unit. The second intermediate node NP2 is a connection node between the fifth NMOS transistor Q5 and the third bias unit.

The third node N3 is a connection node between the fourth NMOS transistor Q4 and the fifth NMOS transistor Q5 that are connected in series. The fourth node N4 is a connection node between the sixth NMOS transistor Q6 and the seventh NMOS transistor Q7.

The third bias unit is connected between the first current mirror and the second current mirror. Specifically, the third bias unit is connected between the fifth PMOS transistor P5 and the fifth NMOS transistor Q5.

The third bias unit includes an eighth PMOS transistor P8 and an eighth NMOS transistor Q8.

The eighth PMOS transistor P8 and the eighth NMOS transistor Q8 are connected in parallel. The source and the drain of the eighth PMOS transistor P8 and the source and the drain of the eighth NMOS transistor Q8 are connected between the first intermediate node NP1 and the second intermediate node NP2.

The eighth PMOS transistor P8 receives a third bias voltage BP3 at the gate thereof. The eighth NMOS transistor Q8 receives a third complementary bias voltage BN3 at the gate thereof.

The fourth bias unit is connected between the first current mirror and the second current mirror. Specifically, the fourth bias unit is connected between the seventh PMOS transistor P7 and the seventh NMOS transistor Q7.

The fourth bias unit includes a first floating bias and a second floating bias. The fourth bias unit includes both the first floating bias and the second floating bias in a single channel buffer.

The fourth bias unit includes a ninth PMOS transistor P9, a ninth NMOS transistor Q9, a tenth NMOS transistor Q10, a tenth PMOS transistor P10, a first switch SW1, and a second switch SW2.

The ninth PMOS transistor P9 is connected between the first output node Node A and the third intermediate node NP3. The ninth PMOS transistor P9 receives a fourth bias voltage BP4 at the gate thereof.

The ninth PMOS transistor P9 is connected to the first output node Node A. The drain of the ninth PMOS transistor P9 is connected to the third intermediate node NP3.

The ninth NMOS transistor Q9 is connected between the third intermediate node NP3 and the fourth output node Node D. The ninth NMOS transistor Q9 receives a fourth complementary bias voltage BN4 through the gate thereof.

For example, the source of the ninth NMOS transistor Q9 is connected to the fourth output node Node D. The drain of the ninth NMOS transistor Q9 is connected to the third intermediate node NP3.

The tenth NMOS transistor Q10 is connected between the first output node Node A and the second output node Node B. The tenth NMOS transistor Q10 receives a fifth complementary bias voltage BN5 at the gate thereof.

For example, the source of the tenth NMOS transistor Q10 is connected to the second output node Node B. The drain of the tenth NMOS transistor Q10 is connected to the first output node Node A.

The tenth PMOS transistor P10 is connected between the third output node Node C and the fourth output node Node D. The tenth PMOS transistor P10 receives a fifth bias voltage BP5 at the gate thereof.

For example, the source of the tenth PMOS transistor P10 is connected to the third output node Node C. The drain of the tenth PMOS transistor P10 is connected to the fourth output node Node D.

The ninth PMOS transistor P9 and the ninth NMOS transistor Q9 are connected in parallel and/or in series with the tenth NMOS transistor Q10 and the tenth PMOS transistor P10.

The second input unit 210b may be or comprise an amplifier. For example, the second input unit 210b may include a folded cascode operational transconductance amplifier (OTA).

The second input unit 210b differentially amplifies a first input signal FB' and a second input signal INPUT'. The second input unit 210b generates first to fourth differentially-amplified currents I1', I2', I3', and I4'.

The second input unit 210b includes a first differential amplifier and a second differential amplifier.

The first differential amplifier includes first and second NMOS transistors Q1' and Q2' that have a common source, and a first bias transistor Q3'.

The first bias transistor Q3' is connected to a second rail rail2' (VSS). The first bias transistor Q3' controls a bias current supplied to the common source of the first and second NMOS transistors Q1' and Q2' based on or in response to a first complementary bias voltage BN1'.

The first bias transistor Q3' is an NMOS transistor including a gate to which the first complementary bias voltage BN1' is input, and a source and a drain connected between a second rail rail2' (VSS) and the common source of the first and second NMOS transistors Q1' and Q2'.

The second rail rail2' supplies a first power supply voltage or ground potential VSS2.

The second differential amplifier includes first and second PMOS transistors P1' and P2' that have a common source, and a second bias transistor P3'.

The second bias transistor P3' is connected to a first rail rail1' (VDD2). The second bias transistor P3' controls a bias current supplied to the common source of the first and second PMOS transistors P1' and P2' based on or in response to a first bias voltage BP1'.

The second bias transistor P3' is a PMOS transistor including a gate to which the first bias voltage BP1 is input, and a source and a drain connected between the first rail rail1' and the common source of the first and second PMOS transistors P1' and P2'.

The first rail rail1' supplies the second power supply voltage VDD2, which is higher than the first power supply voltage VSS2, as described elsewhere herein.

The first NMOS transistor Q1' and the first PMOS transistor P1' receive the first input signal FB' through their respective gates.

The second NMOS transistor Q2' and the second PMOS transistor P2' receive the second input signal INPUT' through their respective gates. Here, the first input signal FB' is one of the output signals OUT1 and OUT2 of the buffer amplifier.

The first and second NMOS transistors Q1' and Q2' are connected to one of the first node N1' and the second node N2' of the second amplifier unit 220b. The first and second NMOS transistors Q1' and Q2' are connected to one of the first node N1' and the second node N2' at their respective drains.

The first and second PMOS transistors P1' and P2' are connected to one of the third node N3' and the fourth node N4' of the second amplifier unit 220b. Specifically, the first and second PMOS transistors P1' and P2' are connected to one of the third node N3' and the fourth node N4' at their respective drains.

For example, in regard to the first to fourth currents I1' to I4' generated by the second input unit 210b, the first current I1' is a current that flows between the drain of the first NMOS transistor Q1' and the first node N1'. The second current I2' is a current that flows between the drain of the second NMOS transistor Q2' and the second node N2'. The third current I3' is a current that flows between the drain of the first PMOS transistor P1' and the third node N3'. The fourth current I4' is a current that flows between the drain of the second PMOS transistor P2' and the fourth node N4'.

The second amplifier unit 220b outputs a control signal based on or in response to the currents generated by the second input unit 210b. The second amplifier unit 220b outputs control signals through first to fourth output nodes Node A' to Node D' based on or in response to the first to fourth currents I1' to I4' generated by the second input unit 210b.

The second amplifier unit 220b includes a first current mirror, a second current mirror, a third bias unit, and a fourth bias unit. For example, the first current mirror and the second current mirror may each be or comprise a cascode current mirror. The third and fourth bias units are floating current sources.

The first current mirror includes fourth to seventh PMOS transistors P4' to P7'. The fourth PMOS transistor P4' and the fifth PMOS transistor P5' are connected in series at the first node N1', which receives the first current I1'. The sixth PMOS transistor P6' and the seventh PMOS transistor P7' are connected in series at the second node N2', which receives the second current I2'.

The first current mirror controls the voltage at the first output node Node A', which is configured to control a first output OUT1 of the output unit based on or in response to at least one of the first current I1', the second current I2', and the second bias voltage BP2'. The first current mirror controls the voltage at the first output node Node A', which is, in turn, configured to control the operation of an eleventh PMOS transistor P11' that outputs the first output OUT1.

For example, the first current mirror includes fourth to seventh PMOS transistors P4' to P7'. The fourth PMOS transistor P4' and the fifth PMOS transistor P5' are connected in series between the second power supply voltage VDD2 (i.e., the first rail rail1') and a first intermediate node NP1'. The fourth PMOS transistor P4' and the fifth PMOS transistor P5' are connected with each other at the first node N1', which receives the first differential current I1'. The sixth PMOS transistor P6' is connected between the second power supply voltage VDD2 and the second node N2', which receives the second current I2'. The seventh PMOS transistor P7 is connected to the first output node Node A'.

The gate of the fourth PMOS transistor P4' and the gate of the sixth PMOS transistor P6' are connected with each other. The gate of the fifth PMOS transistor P5' and the gate of the seventh PMOS transistor P7' are connected with each other. The gate of the fourth PMOS transistor P4' is connected to the source or drain of the fifth PMOS transistor P5'.

The first node N1' is a connection node between the fourth PMOS transistor P4' and the fifth PMOS transistor P5'. The second node N2' is a connection node between the sixth PMOS transistor P6' and the seventh PMOS transistor P7'.

The second current mirror includes fourth to seventh NMOS transistors Q4' to Q7'. The fourth NMOS transistor Q4' and the fifth NMOS transistor Q5' are connected in series with each other at the third node N3', which receives the third current I3'. The sixth NMOS transistor Q6' and the seventh NMOS transistor Q7' are connected in series with each other at the fourth node N4', which receives the fourth current I4'.

The second current mirror controls the voltage at the fourth output node Node D', which is configured to control a second output OUT2 of the output unit based on or in response to at least one of the third current I3', the fourth current I4', and the second complementary bias voltage BN2'. The second current mirror controls the voltage at the fourth output node Node D', which is, in turn, configured to control the operation of a twelfth NMOS transistor Q11' that outputs the second output OUT2.

The fourth NMOS transistor Q4' and the fifth NMOS transistor Q5' are connected in series between the first power supply voltage VSS2 (i.e., the second rail rail2') and a second intermediate node NP2'. The fourth NMOS transistor Q4' and the fifth NMOS transistor Q5' are connected with each other at the third node N3', which receives the third current I3'. The sixth NMOS transistor Q6' is connected between the first power supply voltage VSS2 and the fourth node N4', which receives the fourth current I4'. The seventh NMOS transistor Q7' is connected to the fourth output node Node D'.

The gate of the fourth NMOS transistor Q4' and the gate of the sixth NMOS transistor Q6' are connected with each other. The gate of the fifth NMOS transistor Q5' and the seventh NMOS transistor Q7' are connected with each other. The gate of the fourth NMOS transistor Q4' is connected to the second intermediate node NP2'. The gate of the fourth NMOS transistor Q4' is connected to the source or drain of the fifth NMOS transistor Q5'.

The first intermediate node NP1' and the first output node Node A' are connection nodes between the first current mirror and the fourth bias unit. The second intermediate node NP2' and the fourth output node Node D' are connection nodes between the second current mirror and the fourth bias unit.

For example, the first intermediate node NP1' is a connection node between the fifth PMOS transistor P5' and the third bias unit. The second intermediate node NP2' is a connection node between the fifth NMOS transistor Q5' and the third bias unit.

The third node N3' is a connection node between the fourth NMOS transistor Q4' and the fifth NMOS transistor Q5' that are connected in series with each other. The fourth node N4' is a connection node between the sixth NMOS transistor Q6' and the seventh NMOS transistor Q7'.

The third bias unit is connected between the first current mirror and the second current mirror. Specifically, the third bias unit is connected between the fifth PMOS transistor P5' and the fifth NMOS transistor Q5'.

The third bias unit includes an eighth PMOS transistor P8' and an eighth NMOS transistors Q8'.

The eighth PMOS transistor P8' and the eighth NMOS transistor Q8' are connected in parallel. The source and the drain of the eighth PMOS transistor P8' and the source and the drain of the eighth NMOS transistor Q8' are connected between the first intermediate node NP1' and the second intermediate node NP2'.

The eighth PMOS transistor P8' receives the third bias voltage BP3' at the gate thereof. The eighth NMOS transistor Q8' receives the third complementary bias voltage BN3' at the gate thereof.

The fourth bias unit is connected between the first current mirror and the second current mirror. Specifically, the fourth bias unit is connected between the seventh PMOS transistor P7' and the seventh NMOS transistor Q7'.

The fourth bias unit includes a first floating bias and a second floating bias. The fourth bias unit includes both the first floating bias and the second floating bias within one channel buffer.

The fourth bias unit includes a ninth PMOS transistor P9', a ninth NMOS transistor Q9', a tenth NMOS transistor Q10', a tenth PMOS transistor P10', a first switch SW1', and a second switch SW2'.

The ninth PMOS transistor P9' is connected between the first output node Node A' and a third intermediate node NP3'. The ninth PMOS transistor P9 receives a fourth bias voltage BP4' at the gate thereof.

The ninth PMOS transistor P9' is connected to the first output node Node A'. The drain of the ninth PMOS transistor P9' is connected to the third intermediate node NP3'.

The ninth NMOS transistor Q9' is connected between the third intermediate node NP3' and the fourth output node Node D'. The ninth NMOS transistor Q9' receives a fourth complementary bias voltage BN4' at the gate thereof.

For example, the ninth NMOS transistor Q9' is connected to the fourth output node Node D'. The drain of the ninth NMOS transistor Q9' is connected to the third intermediate node NP3'.

The tenth NMOS transistor Q10' is connected between the first output node Node A' and the second output node Node B'. The tenth NMOS transistor Q10' receives a fifth complementary bias voltage BN5' at the gate thereof.

For example, the source of the tenth NMOS transistor Q10' is connected to the second output node Node B'. The drain of the tenth NMOS transistor Q10' is connected to the first output node Node A'.

The tenth PMOS transistor P10' is connected between the third output node Node C' and the fourth output node Node D'. The tenth PMOS transistor P10' receives a fifth bias voltage BP5' at the gate thereof.

For example, the source of the tenth PMOS transistor P10' is connected to the third output node Node C'. The drain of the tenth PMOS transistor P10' is connected to the fourth output node Node D'.

The ninth PMOS transistor P9' and the ninth NMOS transistor Q9' are connected in parallel and/or in series with the tenth NMOS transistor Q10' and the tenth PMOS transistor P10'.

A body terminal, a body region, or a bulk region of the P-type transistor P11 of the first output buffer unit 230a is connected to the second power supply voltage VDD2.

A body terminal, a body region, or a bulk region of the N-type transistor Q11 of the first output buffer unit 230a is connected to the third power source voltage VDD2MH.

A body terminal, a body region, or a bulk region of the P-type transistor P11' of the second output buffer unit 230b is connected to the third power supply voltage VDD2ML.

A body terminal, a body region, or a bulk region of the N-type transistor Q11' of the second output buffer unit 230b is connected to the first power supply voltage VSS2.

Each of the output levels of the first and second output buffer units 230a and 230b may be fed back to a corresponding one of the first and second input units 210a and 210b (see, e.g., inputs FB and FB').

The output signal OUT1 of the first output buffer unit 230a may be fed back as the second input signal INPUT of the first input unit 210a, and the output signal OUT2 of the second output buffer unit 230b may be fed back as the second input signal INPUT' of the second input unit 210b.

The switch unit 240 performs a switching operation, such that the first amplifier unit 220a and/or the second amplifier unit 220b is connected to or disconnected from the first output buffer unit 230a and/or the second output buffer unit 230b. The switch unit 240 includes a first switch subunit 242 and a second switch subunit 244.

The first switch subunit 242 performs a switching operation, such that the first amplifier unit 220a or the second amplifier unit 220b is connected to or disconnected from the first output buffer unit 230a. The first switch subunit 242 includes first to fourth switches SW1, SW2, SW3, and SW4.

The first switch SW1 connects or disconnects the first output node Node A of the first amplifier unit 220a to or from the P-type transistor P11 of the first output buffer unit 230a.

The second switch SW2 connects or disconnects the first output node Node A' of the second amplifier unit 220b to or from the P-type transistor P11 of the first output buffer unit 230a.

The third switch SW3 connects or disconnects the second output node Node B of the first amplifier unit 220a to or from the N-type transistor Q11 of the first output buffer unit 230a.

The fourth switch SW4 connects or disconnects the second output node Node B' of the second amplifier unit 220b to or from the N-type transistor Q11 of the first output buffer unit 230a.

The second switch unit 244 connects or disconnects the first amplifier unit 220a or the second amplifier unit 220b to or from the second output buffer unit 230b. The second switch unit 244 includes fifth to eighth switches SW5, SW6, SW7, and SW8.

The fifth switch SW5 connects or disconnects the third output node Node C of the first amplifier unit 220a to or from the P-type transistor P11' of the second output buffer unit 230b.

The sixth switch SW6 connects or disconnects the third output node Node C' of the second amplifier unit 220b to or from the P-type transistor P11' of the second output buffer unit 230b.

The seventh switch SW7 connects or disconnects the fourth output node Node D of the first amplifier unit 220a to or from the N-type transistor Q11' of the second output buffer unit 230b.

The eighth switch SW8 connects or disconnects the fourth output node Node D' of the second amplifier unit 220b to or from the N-type transistor Q11' of the second output buffer unit 230b.

The first to eighth switches SW1 to SW8 operate based on or in response to a control signal (e.g., an inverted polarity signal POL) and a complementary control signal (e.g., POLB). The complementary control signal is a signal having a logic level opposite to that of the control signal.

Although the present invention has been described with reference to preferred embodiments, the preferred embodiments are presented to describe the technical spirit of the present invention only for illustrative purposes and those skilled in the art will appreciate that various modifications and changes are possible, without departing from the scope and spirit of the present invention. Therefore, it should be understood that the protection scope of the present invention is defined by the accompanying claims rather than the description which is presented above. Moreover, the present invention is intended to cover not only the exemplary embodiments but also various alternatives, modifications, equivalents and other embodiments that may be included within the spirit and scope of the various embodiments as defined by the appended claims.

What is claimed is:

1. A buffer amplifier comprising:
   a first amplification block;
   a second amplification block;
   a first output buffer unit receiving an output level of the first amplification block;
   a second output buffer unit receiving an output level of the second amplification block; and
   a switch unit configured to connect or disconnect the first amplification block or the second amplification block to or from the first output buffer unit or the second output buffer unit,
   wherein:
     the switch unit includes a first switch unit configured to connect one of the first amplification block and the second amplification block to the first output buffer unit based on or in response to a control signal; and a second switch unit configured to connect a different one of the first amplification block and the second amplification block to the second output buffer unit based on or in response to the control signal; and
     each of the first amplification block and the second amplification block comprises:
       an input unit configured to amplify a first input signal and output first through fourth currents; and
       an amplifier unit including a first current mirror, a second current mirror, and a biasing unit connected between the first current mirror and the second current mirror, wherein the first current mirror includes (i) a first PMOS transistor and a second PMOS transistor connected in series at a first node configured to receive the first current and (ii) a third PMOS transistor and a fourth PMOS transistor connected in series at a second node configured to receive the second current, and the second current mirror includes (i) a first NMOS transistor and a second NMOS transistor connected in series at a third node configured to receive the third current, and (ii) a third NMOS transistor and a fourth NMOS transistor connected in series at a fourth node configured to receive the fourth current.

2. The buffer amplifier according to claim 1, wherein the switch unit is configured to connect one of the first output buffer unit and the second output buffer unit to the amplifier unit.

3. The buffer amplifier according to claim 1, wherein the biasing unit comprises:
   a first bias circuit connected between the second PMOS transistor of the first current mirror and the second NMOS transistor of the second current mirror; and a second bias circuit connected between the fourth PMOS transistor of the first current mirror and the fourth NMOS transistor of the second current mirror.

4. The buffer amplifier according to claim 1, wherein each of the first current mirror and the second current mirror comprises a cascode current mirror.

5. The buffer amplifier according to claim 3, wherein each of the first bias circuit and the second bias circuit includes an N-type transistor and a P-type transistor that are connected in parallel, and each of the N-type transistor and the P-type transistor have a gate configured to receive a bias voltage.

6. The buffer amplifier according to claim 1, wherein:
each of the first output buffer and the second output buffer includes an N-type transistor and a P-type transistor that are connected in series,
the first buffer unit has a first terminal configured to receive a first power supply voltage and a second terminal configured to receive a second power supply voltage,
the second output buffer has a first terminal configured to receive a first power supply voltage and a second terminal configured to receive the second power supply voltage,
the first power supply voltage is higher than the second power supply voltage, and
the third power supply voltage is lower than the second power supply voltage.

7. The buffer amplifier according to claim 1, wherein each input unit is configured to receive feedback from corresponding one of the first output buffer unit and the second output buffer unit.

8. The buffer amplifier according to claim 1, wherein the first switch unit comprises:
a first switch configured to connect or disconnect a first output node of the first amplification block to or from a P-type transistor of the first output buffer unit based on or in response to the control signal;
a second switch configured to connect or disconnect a first output node of the second amplification block to or from the P-type transistor of the first output buffer unit based on or in response to the control signal;
a third switch configured to connect or disconnect a second output node of the first amplification block to or from an N-type transistor of the first output buffer unit based on or in response to the control signal; and
a fourth switch configured to connect or disconnect a second output node of the second amplification block to or from the N-type transistor of the first output buffer unit based on or in response to the control signal.

9. The buffer amplifier according to claim 1, wherein the second switch unit comprises:
a fifth switch configured to connect or disconnect a first output node of the first amplification block to or from a P-type transistor of the second output buffer unit based on or in response to the control signal;
a sixth switch configured to connect or disconnect a first output node of the second amplification block to or from the P-type transistor of the second output buffer unit based on or in response to the control signal;
a seventh switch configured to connect or disconnect a second output node of the first amplification block to or from an N-type transistor of the second output buffer unit based on or in response to the control signal; and
an eighth switch configured to connect or disconnect a second output node of the second amplification block to or from the N-type transistor of the second output buffer unit based on or in response to the control signal.

10. A buffer amplifier comprising:
a first amplification block;
a second amplification block;
a first output buffer unit configured to receive an output level of the first amplification block;
a second output buffer unit configured to receive an output level of the second amplification block; and
a switch unit configured to connect or disconnected the first amplification block or the second amplification block to or from the first output buffer unit or the second output buffer unit,
wherein each of the first amplification block and the second amplification block comprises:
an input unit configured to differentially amplify a first input signal to generate a differential current; and
an amplifier unit configured to output a control signal based on or in response to the differential current, and
the switch unit comprises:
a first switch subunit configured to connect one of the first amplification block and the second amplification block to the first output buffer unit based on or in response to the control signal; and
a second switch subunit configured to connect a different one of the first amplification block and the second amplification block to the second output buffer unit based on or in response to the control signal.

11. The buffer amplifier according to claim 10, wherein the input unit comprises a first differential amplifier including:
a first NMOS transistor connected to one of first and second nodes of the amplifier unit and configured to receive the first input signal at a gate thereof;
a second NMOS transistor connected to a remaining one of the first node and the second node of the amplifier unit and configured to receive a second input signal at a gate thereof; and
a first bias unit connected to a second rail that supplies a first power supply voltage and configured to control a bias current to the first NMOS transistor and the second NMOS transistor based on or in response to a first complementary bias voltage.

12. The buffer amplifier according to claim 11, wherein the input unit further comprises a second differential amplifier including:
a first PMOS transistor connected to one of third and fourth nodes of the amplifier unit and configured to receive the first input signal at a gate thereof;
a second PMOS transistor connected to a remaining one of the third node and the fourth node of the amplifier unit and configured to receive the second input signal at a gate thereof; and
a second bias unit connected to a first rail that supplies a second power supply voltage and configured to control a bias current to the first PMOS transistor and the second PMOS transistor based on or in response to a second complementary bias voltage.

13. The buffer amplifier according to claim 12, wherein the input unit generates a first current, a second current, a third current, and a fourth current,
the first current flows between a drain of the first NMOS transistor and the first node,
the second current flows between a drain of the second NMOS transistor and the second node, the third current flows between a drain of the first PMOS transistor and the third node, and the first current flows between a drain of the second PMOS transistor and the fourth node.

14. The buffer amplifier according to claim 13, wherein the amplifier unit comprises a first current mirror configured to control a voltage at a first output node to the output buffer unit based on or in response to at least one of the first current, the second current, and a first bias voltage, wherein the first current mirror comprises:
a third PMOS transistor and a fourth PMOS transistor connected in series at the first node; and
a fifth PMOS transistor and a sixth PMOS transistor connected in series at the second node.

15. The buffer amplifier according to claim 14, wherein the amplifier unit further comprises a second current mirror configured to control a voltage at a second output node to the output buffer unit based on or in response to at least one of the third current, the fourth current, and a second complementary bias voltage, wherein the second current mirror comprises:
a third NMOS transistor and a fourth NMOS transistor connected in series at the third node; and
a fifth NMOS transistor and a sixth NMOS transistor connected in series at the fourth node.

16. The buffer amplifier according to claim 15, wherein the amplifier unit further comprises a third bias unit connected between the first current mirror and the second current mirror, wherein third bias unit comprises:
a seventh PMOS transistor configured to receive a third bias voltage through a gate thereof; and
a seventh NMOS transistor configured to receive a complementary bias voltage through a gate thereof, and the seventh PMOS transistor and the seventh NMOS transistor are connected in parallel, and a source and a drain of the seventh PMOS transistor and a source and a drain of the seventh NMOS transistor are connected between a first intermediate node and a second intermediate node.

17. The buffer amplifier according to claim 16, wherein the amplifier unit further comprises a fourth bias unit connected between the first current mirror and the second current mirror, the fourth bias unit including a first floating bias and a second floating bias.

18. The buffer amplifier according to claim 10, wherein each of the first output buffer unit and the second output buffer unit includes an N-type transistor and a P-type transistor that are connected in series, the first buffer unit has a first terminal configured to receive a first power supply voltage and a second terminal configured to receive a second power supply voltage, the second output buffer has a first terminal configured to receive a third power supply voltage and a second terminal configured to receive the third power supply voltage, the first power supply voltage is higher than the second power supply voltage, and the third power supply voltage is lower than the second power supply voltage.

19. A buffer amplifier comprising:
a first amplification block;
a second amplification block;
a first output buffer unit receiving an output level of the first amplification block;
a second output buffer unit receiving an output level of the second amplification block; and
a switch unit configured to connect or disconnect the first amplification block or the second amplification block to or from the first output buffer unit or the second output buffer unit, wherein:
the switch unit includes a first switch unit configured to connect one of the first amplification block and the second amplification block to the first output buffer unit based on or in response to a control signal, and a second switch unit configured to connect a different one of the first amplification block and the second amplification block to the second output buffer unit based on or in response to the control signal;
the first switch unit comprises:
a first switch configured to connect or disconnect a first output node of the first amplification block to or from a P-type transistor of the first output buffer unit based on or in response to the control signal;
a second switch configured to connect or disconnect a first output node of the second amplification block to or from the P-type transistor of the first output buffer unit based on or in response to the control signal;
a third switch configured to connect or disconnect a second output node of the first amplification block to or from an N-type transistor of the first output buffer unit based on or in response to the control signal; and
a fourth switch configured to connect or disconnect a second output node of the second amplification block to or from the N-type transistor of the first output buffer unit based on or in response to the control signal; and
the second switch unit comprises:
a fifth switch configured to connect or disconnect a first output node of the first amplification block to or from a P-type transistor of the second output buffer unit based on or in response to the control signal;
a sixth switch configured to connect or disconnect a first output node of the second amplification block to or from the P-type transistor of the second output buffer unit based on or in response to the control signal;
a seventh switch configured to connect or disconnect a second output node of the first amplification block to or from an N-type transistor of the second output buffer unit based on or in response to the control signal; and
an eighth switch configured to connect or disconnect a second output node of the second amplification block to or from the N-type transistor of the second output buffer unit based on or in response to the control signal.

* * * * *